(12) United States Patent
Fukano

(10) Patent No.: US 8,437,170 B2
(45) Date of Patent: May 7, 2013

(54) SEMICONDUCTOR STORAGE DEVICE

(75) Inventor: Gou Fukano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 12/869,049

(22) Filed: Aug. 26, 2010

(65) Prior Publication Data

US 2011/0063889 A1 Mar. 17, 2011

(30) Foreign Application Priority Data

Sep. 11, 2009 (JP) ................................. 2009-210914

(51) Int. Cl.
*G11C 11/00* (2006.01)
(52) U.S. Cl.
USPC .................... 365/148; 365/63; 365/189.14
(58) Field of Classification Search .................. 365/148, 365/63, 189.14
See application file for complete search history.

(56) References Cited

U.S. PATENT DOCUMENTS

| | | | | |
|---|---|---|---|---|
| 6,731,535 | B1 * | 5/2004 | Ooishi et al. .................. | 365/171 |
| 7,248,494 | B2 | 7/2007 | Oh et al. | |
| 7,907,436 | B2 * | 3/2011 | Maejima et al. .............. | 365/148 |
| 8,045,362 | B2 * | 10/2011 | Maejima ........................ | 365/148 |
| 2008/0106922 | A1 * | 5/2008 | Park et al. ........................ | 365/72 |
| 2009/0135637 | A1 | 5/2009 | Takase | |

FOREIGN PATENT DOCUMENTS

| | | |
|---|---|---|
| JP | 2006-79812 | 3/2006 |
| JP | 2009-93724 | 4/2009 |

OTHER PUBLICATIONS

U.S. Appl. No. 12/968,914, filed Dec. 15, 2010, Fukano.
Matthew Crowley, et al. "512 Mb PROM with 8 Layers of Antifuse/Diode Cells." Solid-State Circuits Conference. Digest of Technical Papers. ISSCC 2003 IEEE International. vol. 1. 2003. pp. 284, 285, and 493.
U.S. Appl. No. 13/222,209, filed Aug. 31, 2011, Fukano.

\* cited by examiner

*Primary Examiner* — Toan Le
(74) *Attorney, Agent, or Firm* — Oblon, Spivak, McClelland, Maier & Neustadt, L.L.P.

(57) ABSTRACT

According to one embodiment, a semiconductor storage device includes memory cells including serially-connected variable-resistance layer and diode. A memory cell array includes the memory cells arranged on a plane including a first and second axes and has a first region lying along an edge of the array and a second region lying opposite to the edge with respect to the first region. A first wiring is continuous along the first axis between both ends of the array, partly lies in the second region, and is connected to the first ends of the memory cells. A second wiring lies along the first axis only in the first region, is connected to the first ends of the memory cells, and is divided between adjacent memory cells. A third wiring is continuous along the second axis between both ends of the array, and connected to the second ends of the memory cells.

12 Claims, 18 Drawing Sheets

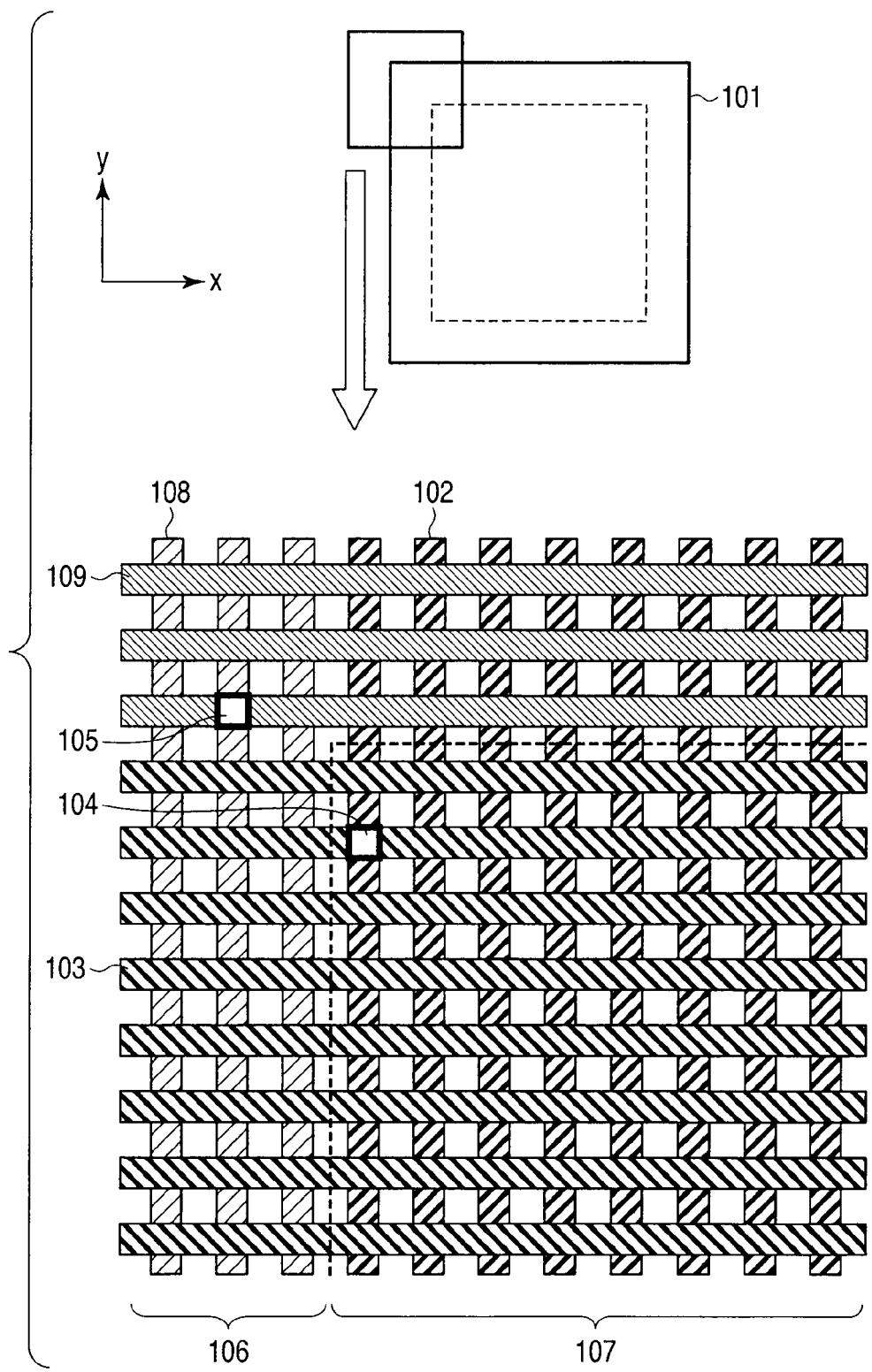
F I G. 1

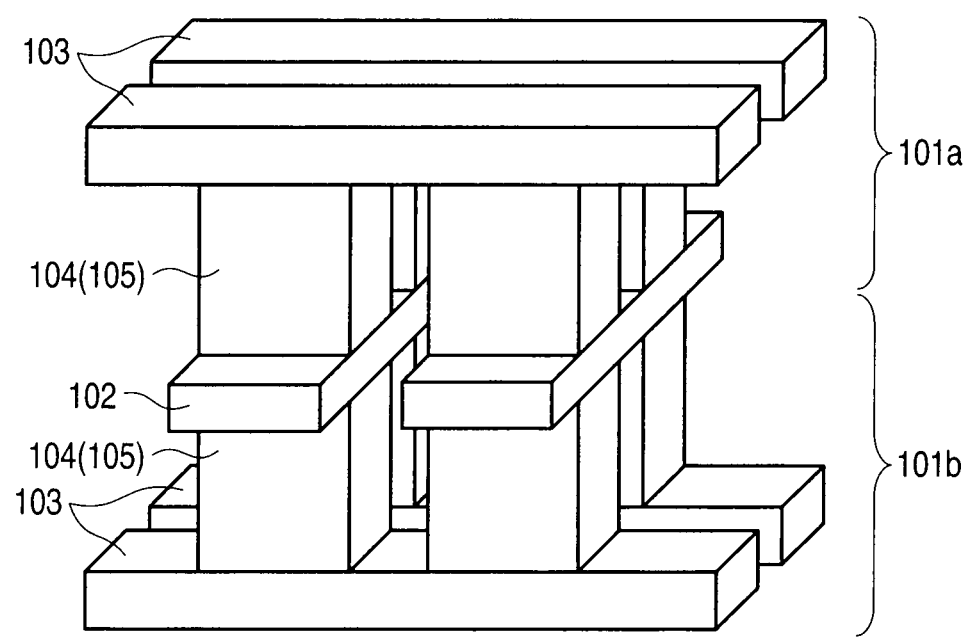
F I G. 2

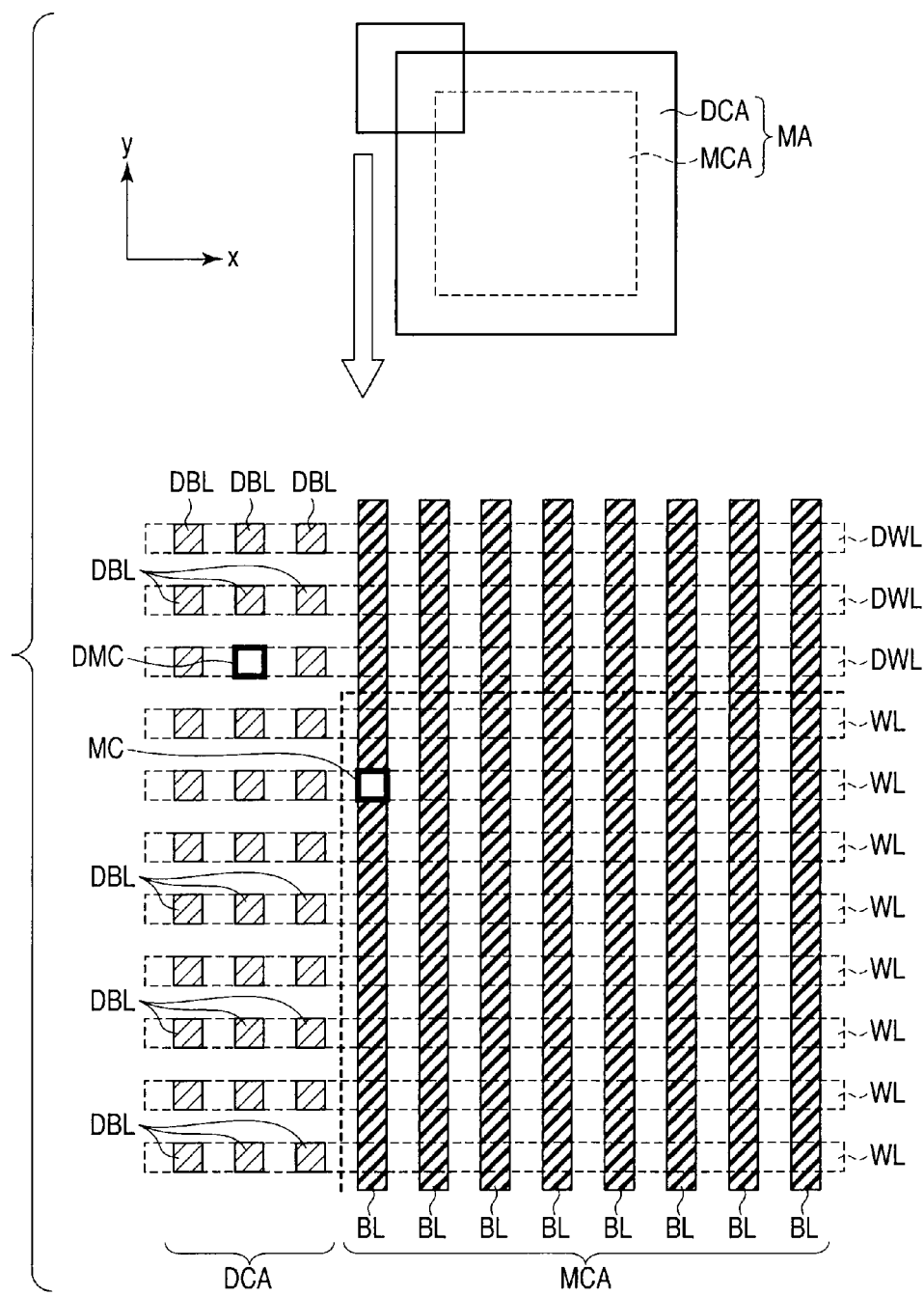
F I G. 6

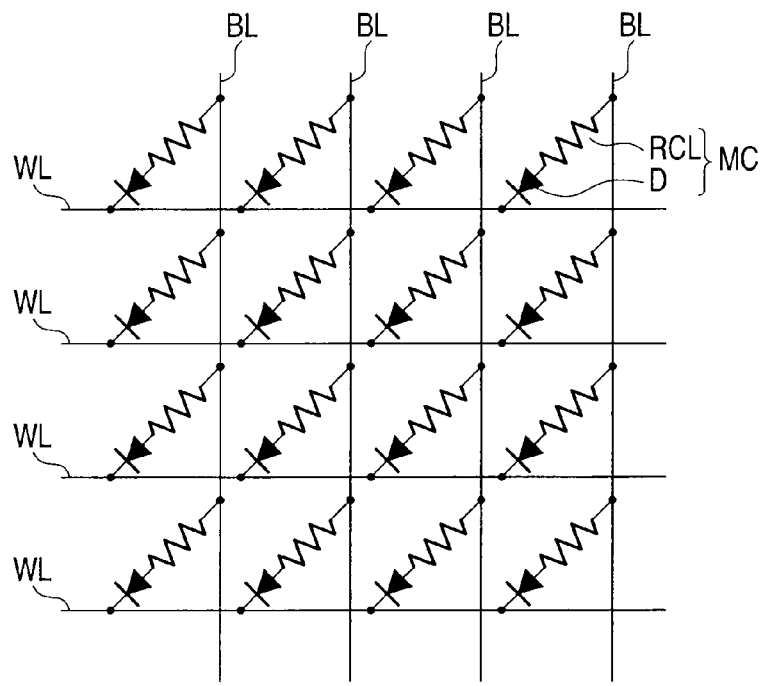
F I G. 9
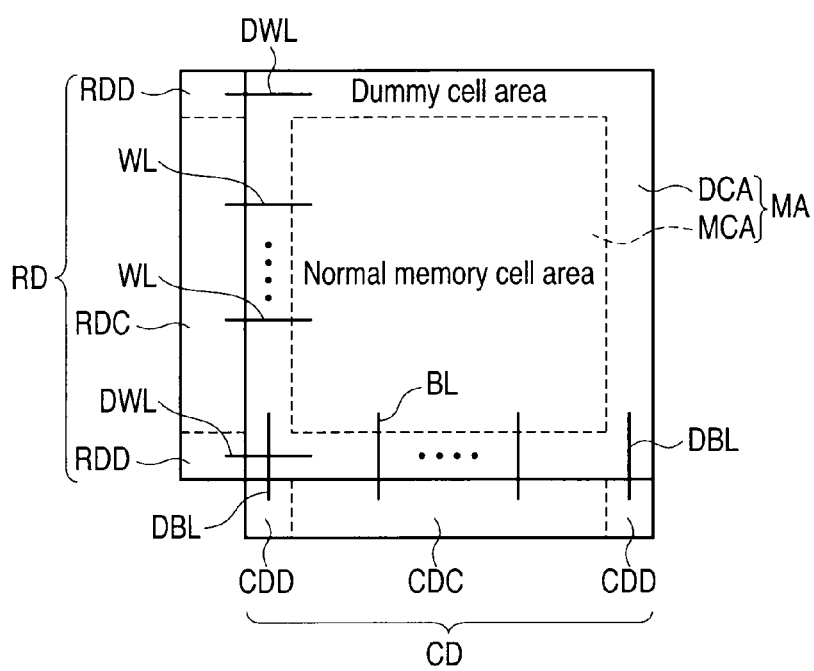
F I G. 10

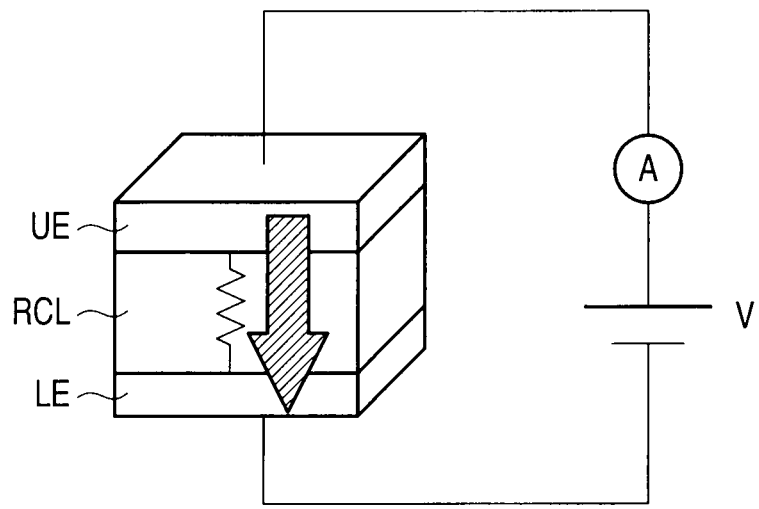
Reset (low resistance → high resistance)
F I G. 11
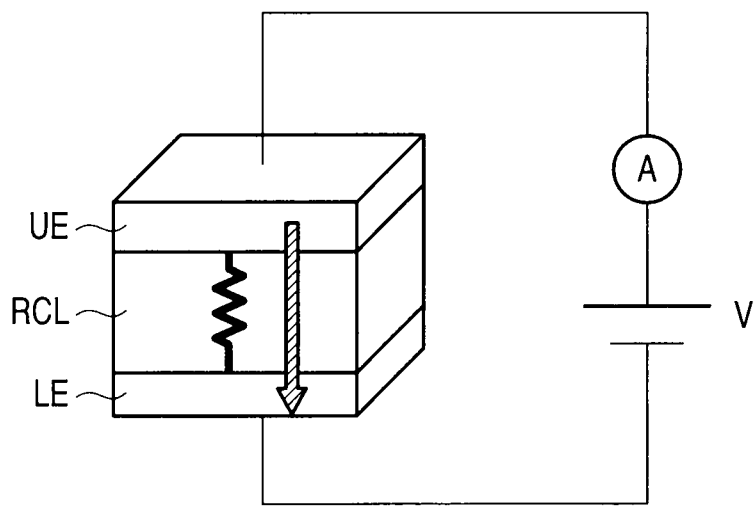
Set (high resistance → low resistance)
F I G. 12

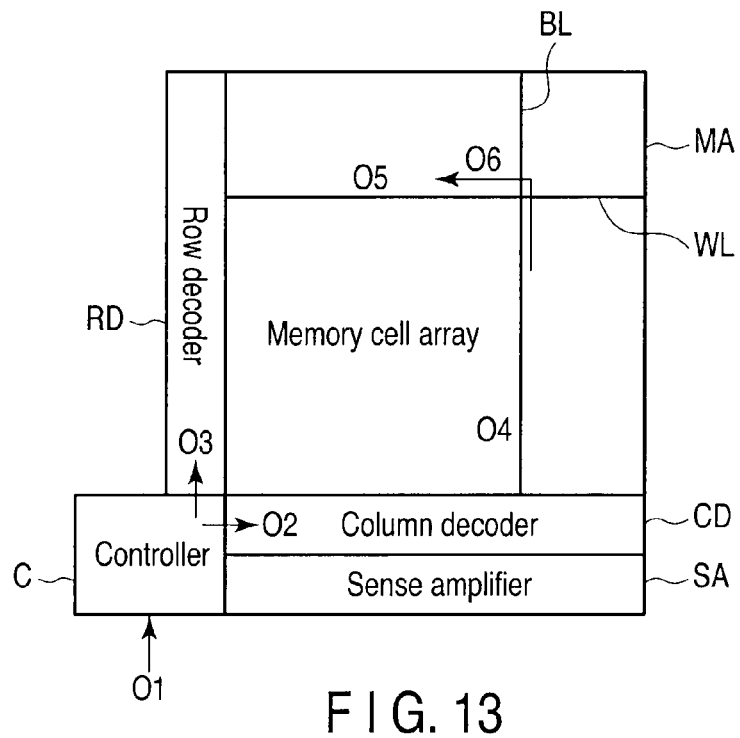
F I G. 13
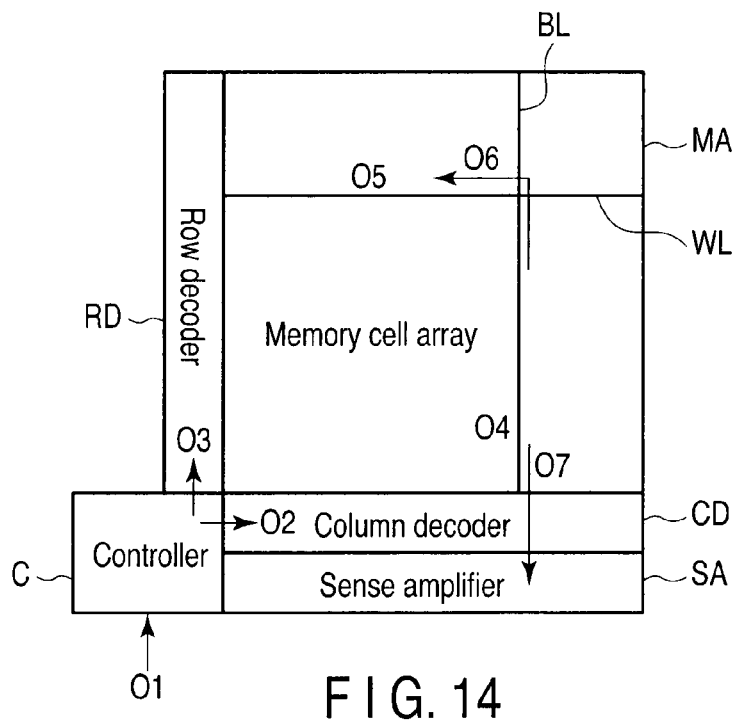
F I G. 14

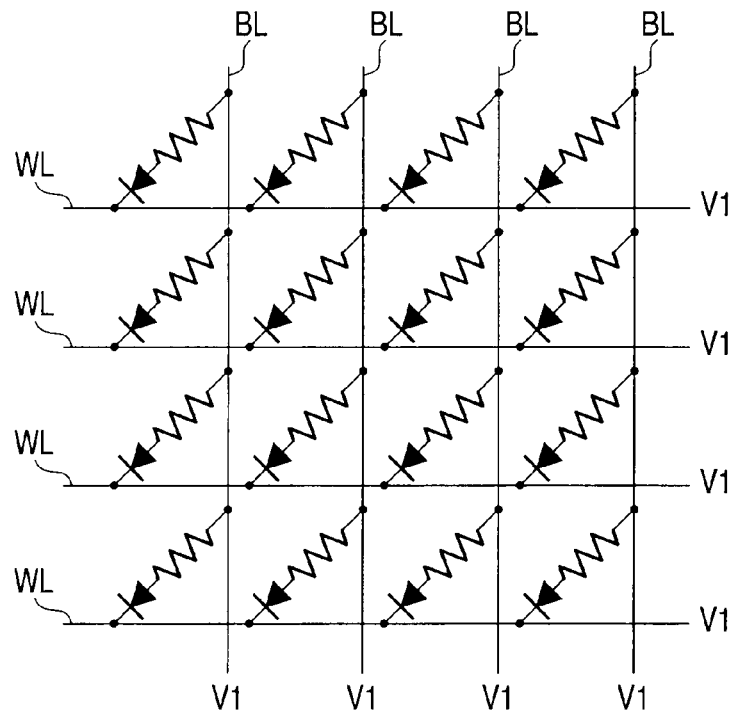
F I G. 15
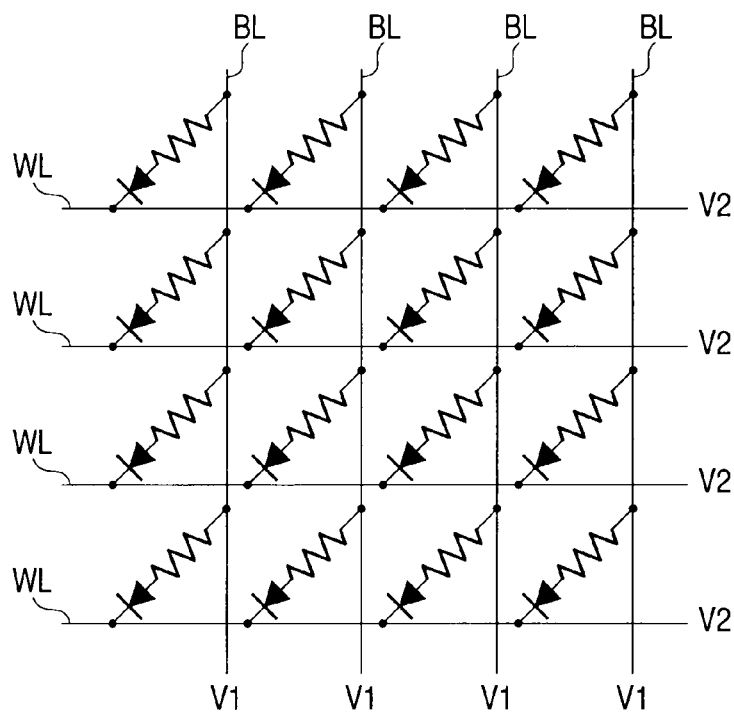
F I G. 16

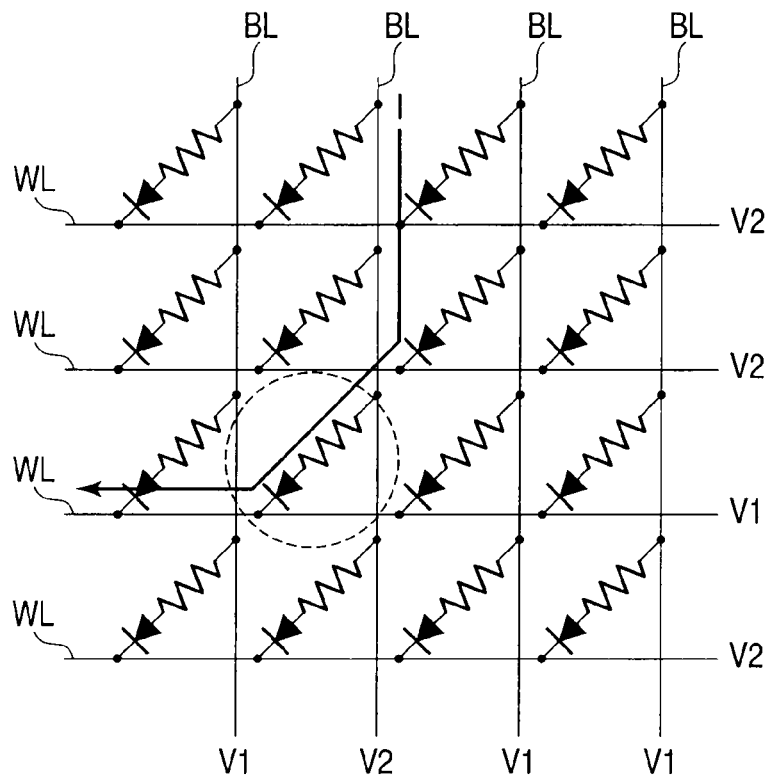
F I G. 17
| | Form | Set | Reset | Reading |
|---|---|---|---|---|
| V1 | V1_FORM | V1_SET | V1_RESET | V1_READ |
| V2 | V2_FORM | V2_SET | V2_RESET | V2_READ |
F I G. 18

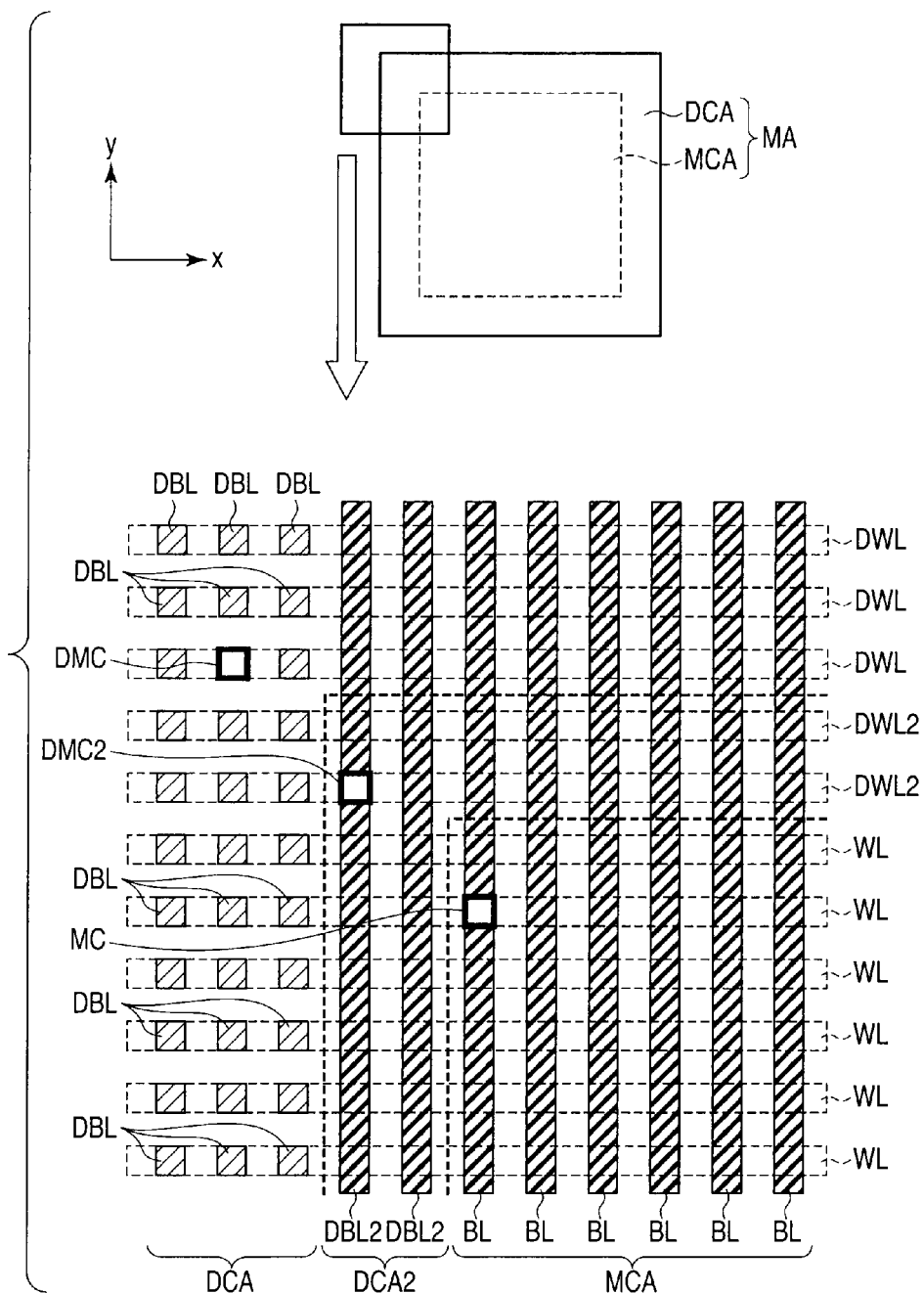
F I G. 19

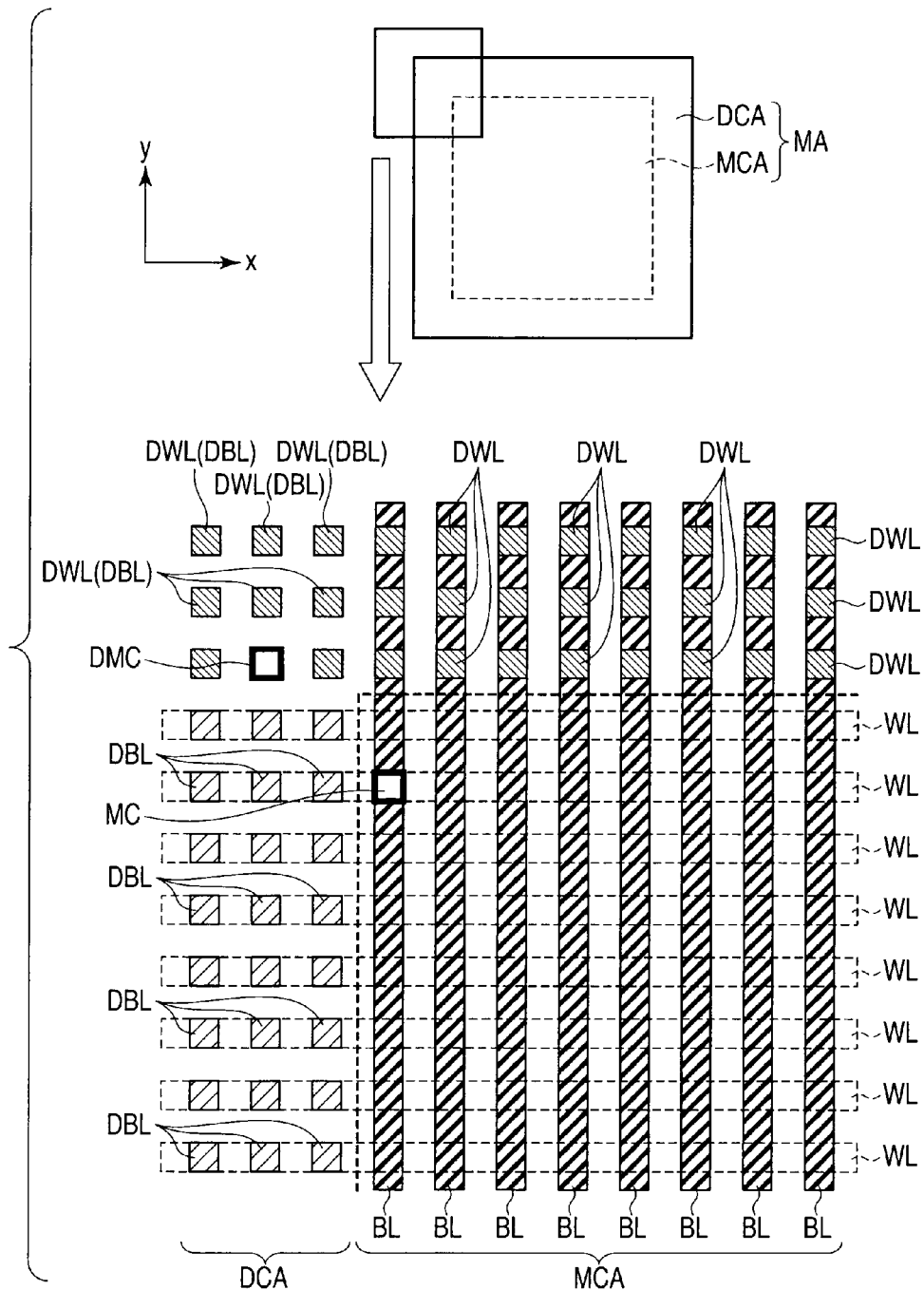
F I G. 23

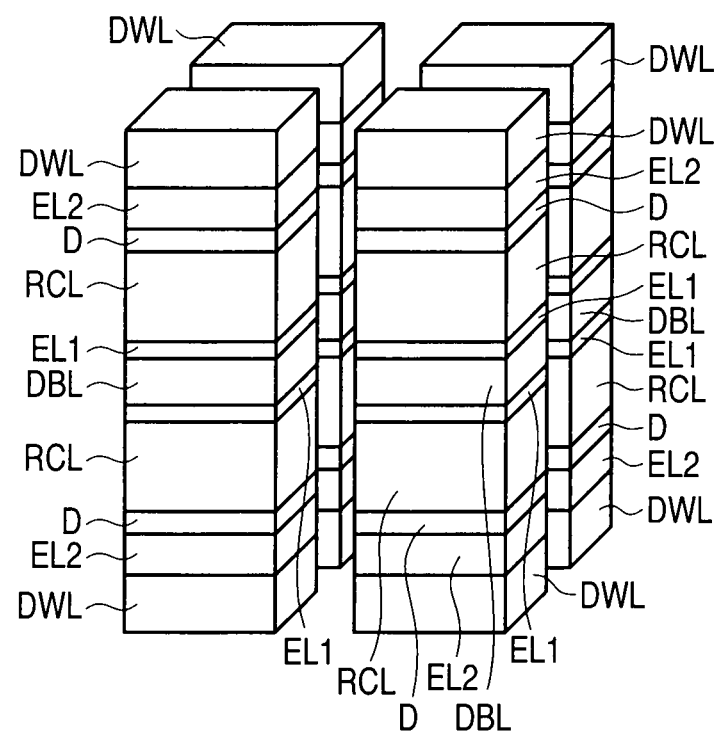
F I G. 24

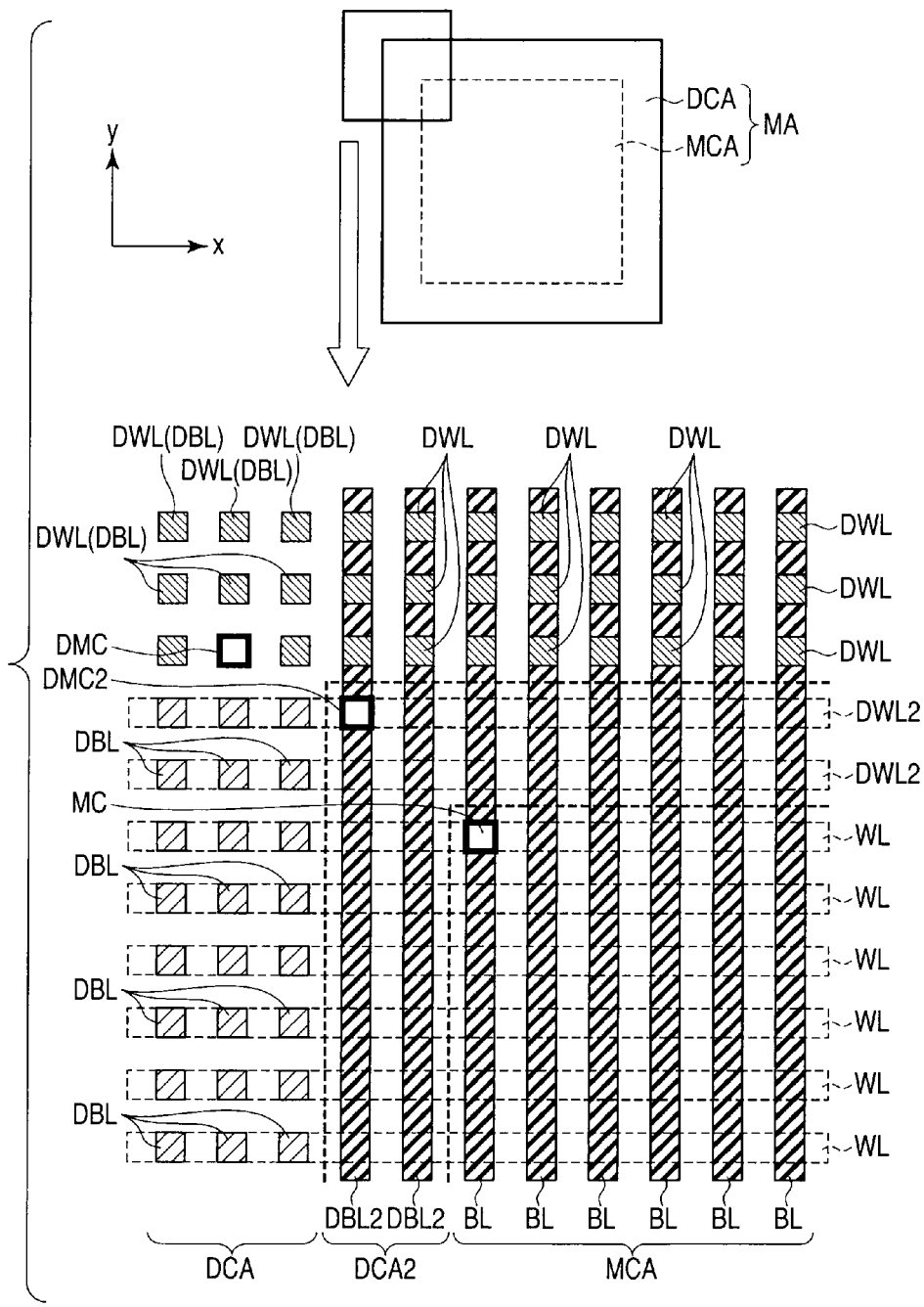
F I G. 25

SEMICONDUCTOR STORAGE DEVICE

CROSS-REFERENCE TO RELATED APPLICATIONS

This application is based upon and claims the benefit of priority from Japanese Patent Application No. 2009-210914, filed Sep. 11, 2009; the entire contents of which are incorporated herein by reference.

FIELD

Embodiments described herein relate generally to a semiconductor storage device.

BACKGROUND

Resistive random access memory (ReRAMs) are known as one of nonvolatile semiconductor storage devices. In ReRAMs, a memory cell includes a variable-resistance layer and a diode which are connected in series, and electrodes holding them therebetween. Each memory cell is connected at one end to a word line, and connected at the other end to a bit line. The internal physical structure of the variable-resistance layer is changed by voltage or current applied thereto, and the resistance thereof is also changed according to the physical structure. One of the two states where the variable-resistance layer has two different resistances is used as the state in which "0" data or "1" data is held, which enables storage of data. Since the state of resistance is maintained even after power supply to the variable-resistance layer is stopped, ReRAMs are nonvolatile memories.

A memory cell array of ReRAMs may include an operation cell area and a dummy cell area. The dummy cell area is an area which runs along edges of the memory cell array, encloses the normal cell area, and serves as a cushion on the boundary between the memory cell array and the outside thereof. Cells located in the dummy cell area are not used as memory. Peripheral circuits and the memory cell array are processed by different processes, and the memory cell array has a structure finer than that of the peripheral circuits and thus is different to be processed. Therefore, memory cells located along edges of the memory cell array are apt to be inferior. These parts which are apt to be inferior are used as dummy area, which enables maintaining a high yield in the operation cell area. The dummy cell area is provided with dummy cells, dummy bit lines, dummy word lines, bit lines, and word lines. The dummy cell area and the normal cell area share the bit lines and the word lines, while the dummy bit lines and the dummy word lines only exist in the dummy cell area.

As described above, both ends of each memory cell are connected to the bit line and the word line, respectively. In addition, to achieve high integration, a structure may be used where memory cells are vertically stacked up with word lines or bit lines interposed two stacked memory cells. In such a structure, memory cells are mutually connected through bit lines, word lines, dummy bit lines, or dummy word lines. When cells made defective by any causes function as simple conductors, a leakage current may be undesirably transmitted to a wide range according to the positions of the defective cells. This impedes application of a desired voltage to a target memory cell, and deteriorates the operation margin of the ReRAM.

BRIEF DESCRIPTION OF THE DRAWINGS

FIG. 1 illustrates an end portion of a memory cell array of a ReRAM of a reference example.

FIG. 2 is a perspective view of a part of a structure of the memory cell arrays of the reference example.

FIG. 6 schematically shows a structure of a part of the memory cell array according to the first embodiment.

FIG. 9 is a circuit diagram of a part of the normal memory cell area.

FIG. 10 is a plan view illustrating details of the peripheral circuits.

FIG. 11 is a diagram for explaining a variable-resistance layer which can be used as a memory cell.

FIG. 12 is a diagram for explaining a variable-resistance layer which can be used as a memory cell.

FIG. 13 illustrates control for formation, set, and reset operations.

FIG. 14 illustrates control for reading operation.

FIG. 15 illustrates potentials of bit lines and word lines when the semiconductor storage device is operated.

FIG. 16 illustrates a state following the state illustrated in FIG. 15.

FIG. 17 illustrates a state following the state illustrated in FIG. 16.

FIG. 18 illustrates potentials of the bit lines and the word lines when the semiconductor storage device is operated.

FIG. 19 schematically illustrates a structure of a part of a memory cell array according to a second embodiment.

FIG. 23 schematically illustrates a structure of a part of a memory cell array according to a fourth embodiment.

FIG. 24 is a perspective view illustrating a part of a structure of a dummy cell area according to the fourth embodiment.

FIG. 25 schematically illustrates a part of a structure of a memory cell array of the fourth embodiment to which the second embodiment is applied.

DETAILED DESCRIPTION

Figure 3:
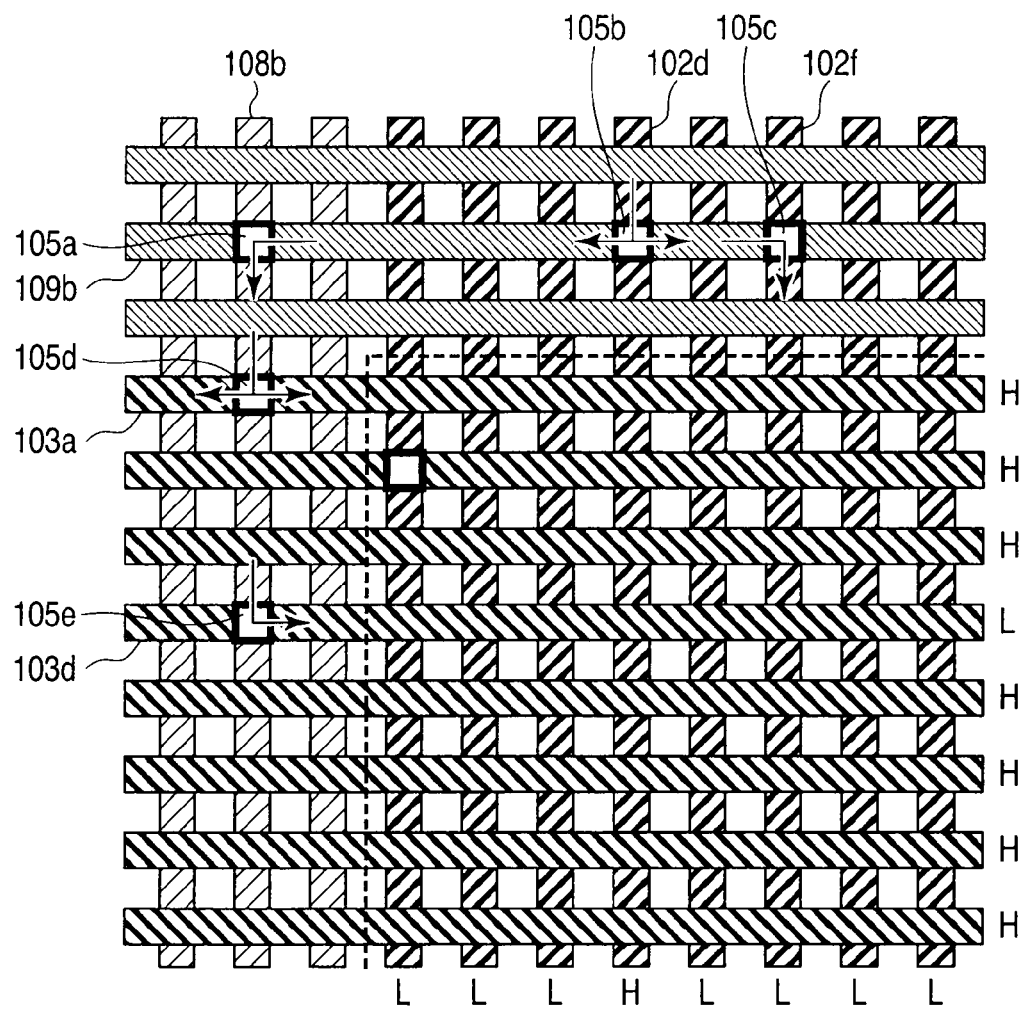
FIG. 3 illustrates a route of a leakage current generated by defective memory cells illustrated in FIG. 1.

In general, according to one embodiment, a semiconductor storage device is disclosed. The device may include memory cells, each of which includes a variable-resistance layer which takes one of two resistance states according to at least one of an applied voltage and an applied current, and a diode having a cathode being connected to the variable-resistance layer, and has both ends of the serial structure of the variable-resistance layer and the diode as a first end and a second end. A memory cell array includes the memory cells arranged on a plane including a first axis and a second axis, and has a first region lying along an edge of the memory cell array and a second region lying opposite to the edge with respect to the first region. A first wiring is continuous along the first axis between both ends of the memory cell array. At least part of the first wiring lies in the second region. The first wiring is connected to the first ends of the memory cells. A second wiring lies along the first axis, lies only in the first region and is connected to the first ends of the memory cells. The second wiring is divided between adjacent memory cells. A third wiring is continuous along the second axis between both ends of the memory cell array, and is connected to the second ends of the memory cells.

The inventors of the present invention researched mechanism that widely propagates the malfunction caused by defective cells in ReRAMs in course of developing the present invention. As a result, the inventors of the present invention have obtained the following knowledge.

FIG. 1 schematically illustrates an end portion of a memory cell array 101 of a ReRAM. As illustrated in FIG. 1, bit lines 102 are provided along the y-direction, and word lines 103 are provided along the x-direction. A memory cell 104 is provided at each of intersection between the bit lines 102 and the word lines 103. As a result, the memory cells 104 are arranged in rows and columns when viewed from above. Among the memory cells 104, memory cells belonging to three rows from the upper end and three rows from the lower end are dummy cells 105. In the same manner, memory cells belonging to three columns from the left end and three columns from the right end are also dummy cells 105. The area outside the broken line in FIG. 1, in which the dummy cells 105 are located, is a dummy cell area 106. An area located more inward than the dummy cell area 106 is a normal cell area 107. The ReRAM includes a plurality of memory cell arrays, and these memory cell arrays are stacked up in the vertical direction. The bit lines 102 and the word lines 103 which are only connected to the dummy cells 105 are dummy bit lines 108 and dummy word lines 109, respectively. The structures of the dummy bit lines 108 and the dummy word lines 109 are the same as those of the bit lines 102 and the word lines 103, respectively.

FIG. 2 illustrates a perspective view illustrating a part of a structure of the memory cell arrays. As illustrated in FIG. 2, memory cell arrays 101a and 101b are provided. Memory cell array 101a includes upper word lines 103, bit lines 102, and memory cells 104 (105) located therebetween. Memory cell array 101b includes the bit lines 102, lower word lines 103, and memory cells 104 (105) located therebetween. The memory cells 104 (105) of memory cell array 101a are connected to the upper word lines 103 and the bit lines 102 at the upper ends and the lower ends, respectively. The memory cells 104 (105) of memory cell array 101b are connected to the bit lines 102 and the lower word lines 103 at the upper ends and the lower ends, respectively. All the memory cells 104 (105) belonging to the same row are connected to the same word line 103 located on the row. All the memory cells 104 (105) belonging to the same column are connected to the same bit line 102 located on the column.

FIG. 3 illustrates a route of a leakage current caused by defective memory cells illustrated in FIG. 1. As illustrated in FIG. 3, defective cells are dummy cells 105a to 105e at coordinates (1, −1), (6, −1), (8, −1), (1, −3) and (1, −6), supposing that the uppermost and leftmost memory cell is the origin of the coordinate axes and the coordinates increase along the x- and y-directions therefrom.

Because of faulty manufacturing, the dummy cells 105a to 105e may be mere conductors between the respective bit lines 102 (or the dummy bit lines 108) and the respective word lines 103 (or the dummy word lines 109) connected to the upper or the lower ends thereof. In such a situation, suppose that bit line 102d and the word line 103d are activated to high level and low level, respectively. First, a current flowing through bit line 102d flows into the dummy word line 109b through the memory cell 105b. The current flowing through the dummy word line 109b flows into non-selected bit line 102f through the dummy cell 105c, and flows into the dummy bit line 108b through the dummy cell 105a. The current which has flown into the dummy bit line 108b further flows into non-selected word line 103a through the dummy cell 105d, and flows into the selected word line 103d through the dummy cell 105e. As described above, according to the positions of defective cells, the potentials of the selected bit line 102d and the selected word line 103d fluctuate from the original potentials which the lines should have. As a result, a target voltage is not applied to the selected bit line 102d and the selected word line 103d, and the operation margin of the ReRAM decreases. In addition, according to the positions of defective cells, the whole memory cell array becomes defective if worst comes to worst. Besides, the current flowing through defective cells is larger than the current flowing through the bit lines 102 and the word lines 103 in normal operation. Such a large current flowing through the memory cell array 101 also causes a problem.

Embodiments of the present invention made on the basis of the above knowledge are explained below with reference to drawings. In the following explanation, components having almost the same function and structure are denoted by the same reference numeral, and overlapping explanation thereof is made only when necessary. Please note that the drawings are typical, and different from actual structures in the relationship between the thickness and the planar dimensions, and the ratio of the thicknesses of the layers. Therefore, the specific thicknesses and dimensions of the components should be determined in view of the following explanation. In addition, the drawings also include parts whose dimensions and ratios are different between drawings, as a matter of course.

First Embodiment

Figure 4:
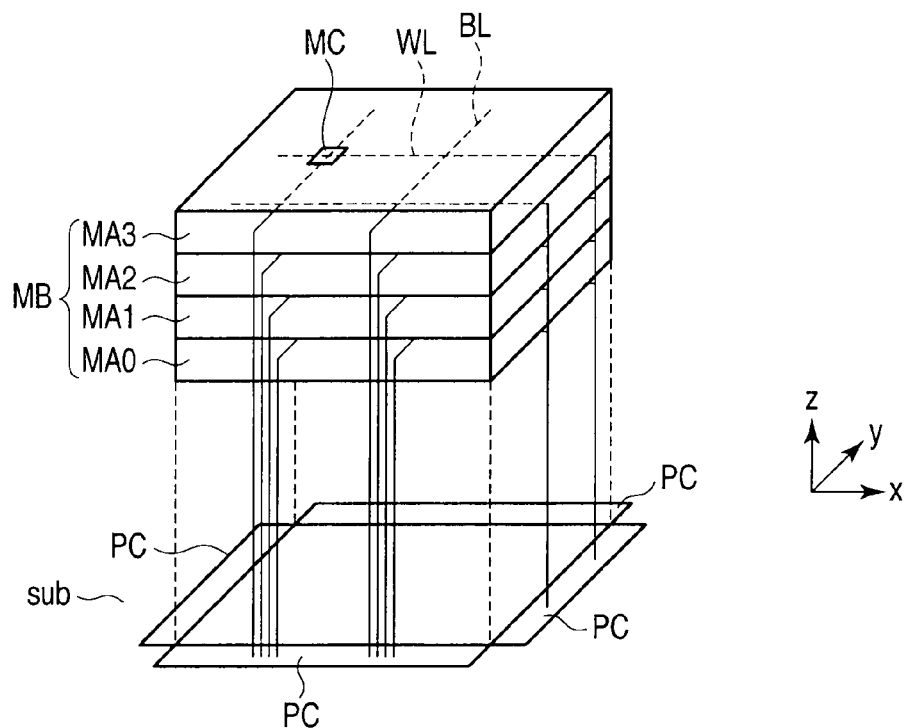
FIG. 4 illustrates a structure of a semiconductor storage device according to a first embodiment.

FIG. 4 schematically illustrates a structure of a semiconductor storage device according to a first embodiment. As illustrated in FIG. 4, a memory block MB is provided above a semiconductor substrate sub. The memory block MB includes a plurality of memory cell arrays MA0 to MA3 which are stacked up along the z-direction. Any number of the memory cell arrays can form the memory block MB. The memory cell arrays MA0 to MA3 have substantially the same size, and have the same structure. Therefore, when the memory cell arrays do not need to be distinguished from one another, and any one memory cell array is representatively used and denoted as "memory cell array MA".

The memory cell array MA has a plurality of memory cells MC. The memory cells MC are arranged in rows and columns, that is, on each coordinates on Cartesian coordinate plane of two axes. In each of memory cell arrays MA0 to MA3, word lines WL are provided along an x-axis (x-direction, or rows) of the memory cell rows and columns, and bit lines BL are provided along a y-axis (y-direction, or columns) of the memory cell rows and columns. Each memory cell MC in the same memory cell array MA is connected at the upper end to one of the corresponding bit line BL and the corresponding word line WL, and connected at the lower end to the other of the corresponding bit line BL and the corresponding word line WL.

In the following explanation, the wording "x-axis", "x-direction", or "row" is used to indicate the right-and-left-direction of the drawing, and the wording "y-axis", "y-direction", or "column" is used to indicate the up-and-down-direction of the drawing, for the convenience. Note, however, that the wordings are not absolute ones, but only serve to distinguish one of two orthogonal directions from the other. Therefore, the first embodiment and the other embodiments are established even when the bit lines BL and the word lines WL are arranged along the y- and the x-directions, respectively.

Two memory cell arrays MA adjacent to each other along the z-direction have a relationship of line symmetry with respect to the boundary between them, and share bit lines BL or word lines WL located in the boundary. Specifically, when it is explained with memory cell array MA2 used as an example, when the memory cells MC in memory cell array MA2 are connected at the upper ends and the lower ends to the word lines WL and the bit lines BL, respectively, the memory cells in memory cell arrays MA1 and MA3 are connected at the upper ends and lower ends to the bit lines BL and the word lines WL, respectively.

The word lines WL project from the edge of the memory cell array MA in the x-direction, and extend toward the substrate sub. In the same manner, the bit lines BL project from the edge of the memory cell array MA in the y-direction, and extend toward the substrate sub. The bit lines BL and the word lines WL are connected to peripheral circuits PC on the substrate sub. The peripheral circuits PC are arranged around the substrate sub located under the memory cell array MA.

Figure 5:
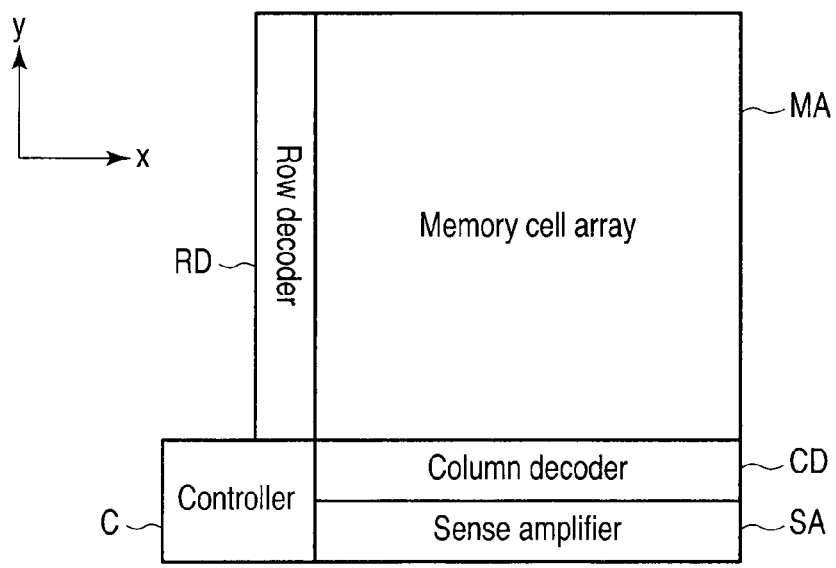
FIG. 5 is a plan view of a memory cell array and peripheral circuits according to the first embodiment.

FIG. 5 is a plan view of the memory cell array MA and the peripheral circuits PC. Specifically, FIG. 5 illustrates a state in which the components are viewed from above. FIG. 5 illustrates only one memory cell array MA as a representative. Note, however, that all the memory cell arrays MA have substantially the same size and are stacked up in the y-direction as described above, and that the following explanation of the representative memory cell array MA applies to all the memory cell arrays MA. The word lines WL and the bit lines BL provided in the x- and y-directions in the memory cell array MA are omitted to simplify the explanation. The memory cells MC are also omitted for the same reason.

As illustrated in FIG. 5, the peripheral circuits PC include, for example, a row decoder RD, a column decoder CD, a sense amplifier SA, and a controller C. The row decoder RD is provided along one end (for example, the left end) located in the x-direction of the memory cell array MA. The column decoder CD is provided along one end (for example, the lower end) located in the y-direction of the memory cell array MA. The sense amplifier SA is provided along the column decoder CD on a side opposite to the memory cell array MA. The controller C is provided in a corner formed by the row decoder RD and the column decoder CD, and between the row decoder RD and the column decoder CD. Each word line WL is connected to the row decoder RD, and each bit line BL is connected to the column decoder CD. The controller C supplies, to the row decoder RD and the column decoder CD, predetermined signals for executing writing and reading operation in and from a memory cell MC designated by an address signal supplied from the outside. The row decoder RD and the column decoder CD are controlled by the signals. The sense amplifier SA amplifies a signal read from the memory cell MC, in accordance with control by the controller C. More detailed operation of the components illustrated in FIG. 5 will be explained later, including access operation to the memory cell array MA.

FIG. 6 schematically illustrates a part of a structure of the memory cell array MA according to the first embodiment, as viewed from above. As illustrated in FIG. 6, the memory cell array MA has a rectangular shape, and includes a plurality of memory cells MC. The memory cells MC are arranged in rows and columns. Among the memory cells MC, memory cells belonging to a predetermined number (3 being used as example in FIG. 6) of rows from each of the upper end and the lower end function as dummy cells DMC. In the same manner, memory cells belonging to a predetermined number (3 being used as example in FIG. 6) of columns from each of the left end and the right end also function as dummy cells DMC. The other memory cells MC function as normal memory cells which store information. A normal memory cell area MCA in which the normal memory cells MC are arranged is enclosed by a dummy cell area DCA in which the dummy cells DMC are arranged.

FIG. 6 illustrates a memory cell array as an example, in which word lines WL and dummy word lines DWL explained below are located above bit lines BL and dummy bit lines DBL explained below, in the z-direction.

The bit lines BL are arranged on respective columns along the y-direction of the memory cell array MA at regular intervals (for example, the minimum feature size F), and extend from the upper end to the lower end of the memory cell array MA without discontinuation. The bit lines BL have a width of the minimum feature size F, for example. Among the bit lines BL, bit lines BL which run through only the dummy cell area DCA are defined as dummy bit lines DBL. However, the bit lines BL and the dummy bit lines DBL have the same structure. Bit lines BL which also run through the normal memory cell area MCA as well as the dummy cell area DCA are not defined as dummy bit lines DBL, but normal bit lines BL.

The word lines WL which run through the normal memory cell area MCA are arranged on respective rows along the x-direction of the memory cell array MA at regular intervals (for example, the minimum feature size F), and extend from the left end to the right end of the memory cell array MA without discontinuation. The word lines WL have a width of the minimum feature size F, for example. Among the word lines WL, word lines WL which run through only the dummy cell area DCA are defined as dummy word lines DWL. However, the word lines WL and the dummy word lines DWL have the same structure. Word lines WL which also run through the normal memory cell area MCA as well as the dummy cell area DCA are not defined as dummy word lines DWL, but normal word lines WL.

Figure 7:
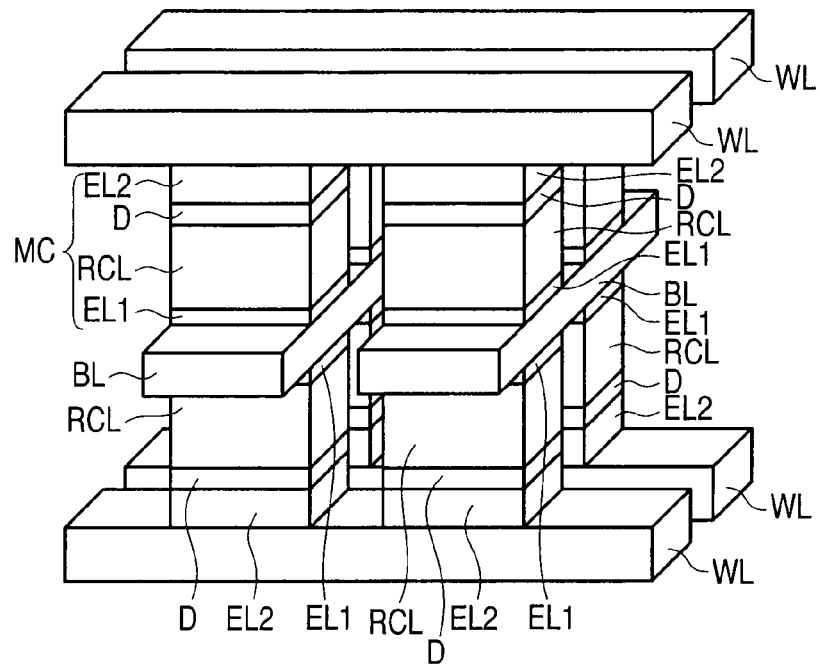
FIG. 7 is a perspective view illustrating a part of a structure of a normal memory cell area according to the first embodiment.

FIG. 7 is a perspective view illustrating a part of a structure of the normal memory cell area MCA according to the first embodiment. FIG. 7 illustrates two memory cell arrays MA. One memory cell array MA includes upper word lines WL, bit lines BL, and memory cells (normal memory cells) MC located between them, and referred to as memory cell array MA1 for convenience. The other memory cell array MA includes lower word lines WL, the bit lines BL, and memory cells (normal memory cells) MC located between them, and referred to as memory cell array MA2, in accordance with dealing with the upper memory cell array MA as memory cell array MA1. The word lines WL and the bit lines BL are shared by two adjacent memory cell arrays MA.

Each memory cell at least includes a diode D and a variable-resistance layer RCL. The diode D and the variable-resistance layer RCL are stacked up. The diode D includes a plurality of stacked layers. The memory cell MC includes two electrode layers, if necessary. One electrode layer EL1 is provided on a surface of the variable-resistance layer RCL opposite to the diode D. The other electrode layer EL2 is provided on a surface of the diode D opposite to the variable-resistance layer RCL. The memory cell MC may include other layers, if necessary.

The variable-resistance layer RCL has at least two steady states, in accordance with the applied voltage and/or current.

The two steady states have different resistances. Any layers exhibiting such a feature can be used as variable-resistance layer RCL. For example, a substance whose internal physical state changes according to the applied voltage and (or) current can be used. For example, a strongly-correlated material corresponds to such a substance. More specifically, $PbTiO_3$, $SrTiO_3$, $SrZrO_3$, $Pr_{0.7}Ca_{0.3}MnO_3$, and $NiO$ can be used.

In the memory cell array MA which has the word lines WL and the bit lines BL on the upper side and the lower side, respectively, like memory cell array MA1, each memory cell MC has a variable-resistance layer RCL on the lower side, and a diode D on the upper side. On the other hand, each memory cell MC of memory cell array MA2 has a structure of line symmetry with the memory cells of adjacent memory cell arrays MA1 and MA3 with respect to the word lines WL or the bit lines BL. Specifically, in the memory cell array having the bit lines BL and the word lines WL on the upper side and the lower side, respectively, each memory cell MC has a variable-resistance layer RCL on the upper side, and a diode D on the lower side. The memory cell MC is connected at electrode EL1 to the bit line BL, and connected at electrode EL2 to the word line WL.

In the normal memory cell area, each word line WL is connected to all the memory cells MC belonging to the row to which the word line WL belongs and located in the same memory cell array MA as the memory cell array MA which includes the word line WL. In the same manner, each bit line BL of the normal memory cell area is connected to all the memory cells MC belonging to a column to which the bit line BL belongs and located in the same memory cell array MA as the memory cell array MA which includes the bit line BL.

Figure 8:
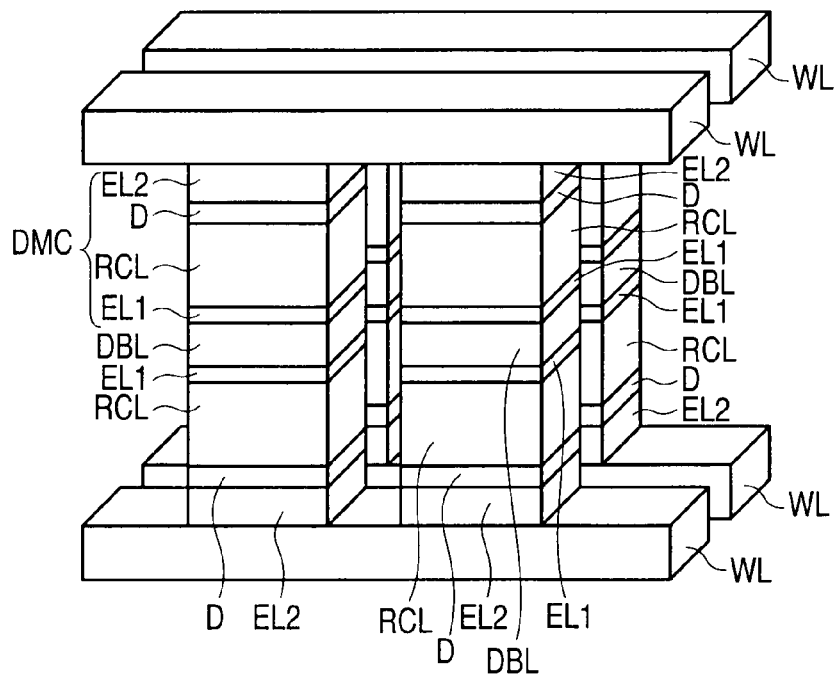
FIG. 8 is a perspective view illustrating a part of a structure of a dummy cell area according to the first embodiment.

On the other hand, in FIG. 6 again, bit lines BL lying only in the dummy cell area DCA, or the dummy bit lines DBL are divided into parts for respective memory cells MC. FIG. 8 is a perspective view illustrating a part of a structure of the dummy cell area DCA according to the first embodiment. FIG. 8 illustrates two memory cell arrays MA, like FIG. 7. An upper memory cell array MA, which is similar to that in FIG. 7, and the upper memory cell array MA in FIG. 7 form a memory cell array MA (for example, memory cell array MA1) together with the upper memory cell array MA in FIG. 7. In the same manner, a lower memory cell array MA, which is similar to that in FIG. 7, and the lower memory cell array MA in FIG. 7 form a memory cell array MA (for example, memory cell array MA2). Memory cells MC and dummy cells DMC in the same memory cell array MA have the same structure. More specifically, layers forming the memory cells MC are obtained by processing the same layers, and the order of stacked layers are the same between the memory cells MC. As a matter of course, each dummy cell DMC is connected at electrode EL1 to the corresponding dummy bit line BL, and connected at electrode EL2 to the corresponding word line WL. The word lines WL and the dummy word lines DWL includes the same layers, and the bit lines BL and the dummy bit lines DBL includes the same layers.

As is clear from FIG. 8, the dummy bit lines DBL are divided for each memory cell MC and independent of one another, unlike the bit lines BL. The planar shape of the dummy bit lines DBL can be the same as the planar shape of the memory cells MC (dummy cells DMC). On the other hand, the bit lines BL which also lies in the normal memory cell area MCA as well as the dummy cell area DCA are continuous like the bit lines BL, and are connected to all the memory cells MC belonging to respective rows to which the respective bit lines BL belong and lying in the same memory cell array MA as the memory cell array MA which include the respective bit lines BL. In the memory cell array MA, only some of dummy bit lines DBL may be separate, and the other dummy bit lines DBL may be continuous like prior art. Further, the planar shape of one separate dummy bit line DBL may be common to all the memory cell arrays MA, or may be limited to one or some of the memory cell arrays MA.

FIG. 9 schematically illustrates a part of a circuit configuration of the normal memory cell area MCA. As illustrated in FIG. 9, word lines WL and bit lines BL form a latticed pattern, and a memory cell MC is provided in each intersection of the latticed pattern. Each memory cell MC is connected at one end to one of bit line BL and word line WL which cross at an intersection of the latticed pattern, and connected at the other end to the other of the bit line BL and the word line WL. Each memory cell MC includes a variable-resistance layer RCL and a diode D. The variable-resistance layer RCL is connected at one end to the bit line, and connected at the other end to an anode of the diode D. A cathode of the diode D is connected to the word line WL.

FIG. 10 is a plan view illustrating the peripheral circuits in more detail. As illustrated in FIG. 10, the column decoder CD includes dummy control circuits CDD to control the dummy bit lines DBL. The dummy control circuits CDD lie under the dummy cell area located at the left end and the right end of the memory cell area MA. A part of the column decoder CD other than the dummy control circuits CDD is referred to as decoder circuit CDC. The decoder circuit CDC and the dummy control circuits CDD are separate circuits. The decoder circuit CDC is connected to the bit lines BL, and configured to apply a predetermined voltage, which differs according to operation, to a specific bit line BL determined in accordance with a signal from the outside. On the other hand, the dummy control circuits CDD are connected to the dummy bit lines DBL. The dummy bit lines DBL are connected to only the dummy cells DMC, and the dummy cells DMC not hold no data. The dummy control circuits CDD function as a power supply to maintain the dummy bit lines DBL at a fixed potential, as a circuit used for testing the operation of the semiconductor storage device, and as a decoder circuit for selecting a specific dummy bit line DBL in test. The dummy control circuits CDD may be configured to apply potentials necessary for writing and reading data in and from a selected memory cell MC, like the decoder circuit CDC. However, when all the dummy bit lines DBL in all the memory cell arrays MA are divided into parts for respective dummy cells DMC, it is unnecessary to connect the dummy bit lines DBL to the dummy control circuits CDD.

Further, the row decoder RD includes dummy control circuits RDD to control the dummy word lines DWL. The dummy control circuits RDD lie on the left side of parts of the dummy cell area DCA located at the upper end and the lower end of the memory cell array MA. A part of the row decoder RD other than the dummy control circuits RDD is referred to as decoder circuit RDC. The decoder circuit RDC and the dummy control circuits RDD are separate circuits. The decoder circuit RDC is connected to the word lines WL, and configured to apply a predetermined voltage, which differs according to operation, to a specific word line WL determined in accordance with a signal from the outside. On the other hand, the dummy control circuits RDD are connected to the dummy word lines DWL. The dummy word lines DWL are connected to only the dummy cells DMC, and the dummy cells DMC do hold no data. The dummy control circuits RDD function as a power supply to maintain the dummy word lines DWL at a fixed potential, as a circuit used for testing the operation of the semiconductor storage device, and as a decoder circuit for selecting a specific dummy word line DWL in test. The dummy control circuits RDD may be configured to apply potentials necessary for writing and reading data in and from a memory cell MC, like the decoder circuit RDC.

FIGS. 11 and 12 are diagrams for explaining a variable-resistance layer which can be used for memory cells MC. As illustrated in FIGS. 11 and 12, the variable-resistance layer RCL can have two steady states. One is a low-resistance state, which is illustrated in FIG. 11. The other is a high-resistance state, which is illustrated in FIG. 12. A predetermined voltage and/or current are applied to the variable-resistance layer RCL through two electrodes UE and LE which hold the variable-resistance layer RCL therebetween, and thereby the variable-resistance layer RCL is changed to the low-resistance state or the high-resistance state. The voltage to change the state has different intensities, depending on whether the resistance after change is low or high. In the following explanation, an operation of changing the variable-resistance layer RCL from the low-resistance state to the high-resistance state is referred to as "reset", and an operation of changing the variable-resistance layer RCL from the high-resistance state to the low-resistance state is referred to as "set", for the sake of convenience. Operation for the memory generally includes at least two operations of data reading and data writing, and the reset and the set operations correspond to writing among them. In each of the states illustrated in FIGS. 11 and 12, data held by the variable-resistance layer can be read, by reading the difference in resistance between the states with a current smaller than that necessary for writing.

Generally, two operations of reading and writing are defined, in memories. An operation "form" is also required for ReRAMs. The operation "form" has to be executed before reading and writing. Variable-resistance layers cannot selectively change from an initial state after formation thereof to two resistance states without any processing. Therefore, it is necessary to apply a voltage higher than reading and writing voltages to the variable-resistance layer before reading and writing, to change the physical structure of the variable-resistance layer such that the variable-resistance layer can be changed to the two resistance states. This voltage applying operation is referred to as "form". The operation "form" is different from "set" and "reset" only in the voltage, and related processing thereof is the same as those of "set" and "reset".

FIGS. 13 and 14 schematically illustrate controls for operations of the semiconductor storage device. FIG. 13 illustrates control for form, set, and reset operations. FIG. 14 illustrates control for reading. As illustrated in FIG. 13, an address signal and a signal for data to be written are supplied from the outside to the controller C (operation O1). In accordance with the signals, the controller C outputs a signal to form, set, or reset a designated memory cell MC to the column decoder CD and the row decoder RD (operations O2 and O3). In accordance with the received signal, the column decoder CD and the row decoder RD control the designated bit line BL and the designated word line WL, respectively, to respective potentials suitable for the operation (operations O4, and O5). As a result, a memory cell MC located in an intersection between the selected bit line BL and the selected word line WL is subjected to form, set or reset operation (operation O6).

As illustrated in FIG. 14, reading operation is the same as form, set and reset operations up to operations O1 to O6. However, as described above, the potentials applied to the selected bit line BL and the selected word line WL are potentials for reading. After the selected bit line BL and the selected word line WL are controlled to such potentials, a current flowing through the selected bit line BL is sensed by the sense amplifier SA, and data held by the selected memory cell MC is read (operation O7).

FIGS. 15, 16 and 17 successively illustrate change in potentials of the bit lines BL and the word lines WL when the semiconductor storage device is operated. The operations include all the form, set, reset, and reading operations. In each of the four operations, two different potentials are used. Specifically, as illustrated in FIG. 18, potentials V1_FORM and V2_FORM are used in the form operation, potentials V1_SET and V2_SET are used in the set operation, potentials V1_RESET and V2_RESET are used in the reset operation, and V1_READ and V2_READ are used in the reading operation. Potentials V1_FORM, V1_SET, V1_RESET, and V1_READ are smaller than potentials V2_FORM, V2_SET, V2_RESET, and V2_READ, respectively. Potentials V1_FORM, V1_SET, V1_RESET, and V1_READ can be, for example, 0V. Since using two different potentials is common to all the operations, the smaller potential is denoted by V1 and the larger potential is denoted by V2, regardless of the type of the operation, in FIGS. 15, 16, and 17 and the following explanation.

As illustrated in FIG. 15, in a standby state, the potentials of all the word lines WL and all the bit lines BL are set to potential V1. As a result, no voltage is applied to all the memory cells MC. Next, as illustrated in FIG. 16, all the word lines are driven to potential V2 prior to the operation. As a result, a reverse bias is applied to (diodes D of) all the memory cells MC.

Next, as illustrated in FIG. 17, a selected bit line BL and a selected word line WL which are connected to a selected memory cell MC enclosed by a broken line are set to potential V2 and potential V1, respectively. The non-selected bit lines BL and the non-selected word lines WL are maintained at potential V2 and potential V1, respectively. As a result, a forward bias is applied to only the selected memory cell MC, and a current I according to the form, set, reset, or reading operation flows through only the selected memory cell MC. On the other hand, no voltage is applied to memory cells MC which are connected to only one of the selected bit line BL and the selected word line WL, and the reverse bias is applied to memory cells MC which are connected to both the respective non-selected bit lines BL and the respective non-selected word lines WL. Therefore, no current flows through the non-selected memory cells MC.

As described above, according to the semiconductor storage device according to the first embodiment, the bit lines BL, the word lines WL, and the dummy word lines DWL are continuous, while the dummy bit lines DBL are divided into parts for respective memory cells MC, and independent of one another. Therefore, each dummy bit line DBL is connected to only one dummy cell DMC. Therefore, even when a dummy cell DMC is a mere low-resistance conductor because of failure and thus the dummy bit line DML and the word line WL which are connected with the dummy cell DMC are always electrically connected, a current flowing through the dummy cell DMC does not reach other dummy cells DMC. Specifically, the range through which a leakage current flowing through a defective dummy cell DMC flows is limited to only the defective dummy cell DMC. This prevents a leakage current from flowing into a wide range, by successively flowing through a plurality of defective dummy cells DMC. As a result, it is prevented that the potentials of the bit lines BL and the word lines WL fluctuate beyond the acceptable range because of failure of dummy cells DMC which make no contribution to data storage capacity, and it is prevented that normal operation of the semiconductor storage device is obstructed.

Second Embodiment

A second embodiment is used with the first embodiment, and has a further dummy cell area.

In the dummy cell area DCA, dummy bit lines DBL are divided into parts for respective memory cells MC. Dummy bit lines DBL are typically formed by forming a layer which will serve as a material of the dummy bit lines and bit lines BL in a region in which the dummy bit lines DBL and the bit lines BL are to be formed, and patterning a part of the layer into shapes of the dummy bit lines DBL. Therefore, the process and process condition for the dummy cell area DCA are different from those for a normal memory cell area MCA. In other words, uniformity of process is broken between the normal memory cell area MCA and the dummy cell area DMC. Nonuniformity of the process affects the processed shape of the layer, in particular, around the boundary in which the uniformity changes. Therefore, memory cells MC along the outer periphery of the normal memory cell area MCA may not be processed to a target shape, and do not have the same shape as the shape of normal memory cells MC located in other positions. In particular, this tendency becomes remarkable when the minimum dimension of the process is fine. Such fluctuations in dimension causes occurrence of fluctuations in the operation margin between the normal memory cells MC, and is not preferable. Therefore, there are cases where it is effective in practical use to provide a further buffer area in the vicinity of the boundary of the normal memory cell area MCA. This modification is an embodiment which has been thought out in view of the above background.

FIG. 19 schematically illustrates a part of a structure of a memory cell array MA according to the second embodiment, as viewed from above. As illustrated in FIG. 19, the normal memory cell area MCA has a second dummy cell area DCA2 which is provided around the outer periphery of the normal memory cell area MCA. In the second embodiment, the area which is referred to as dummy cell area DCA in the first embodiment is referred to as first dummy cell area, to distinguish it from the second dummy cell area DCA2. The size of the second dummy cell area DCA2 is determined to prevent the difference in the process between the first dummy cell area DCA and the normal memory cell area MCA from affecting the normal memory cell area MCA. Specifically, the second dummy cell area DCA2 corresponds to, for example, two rows and two columns of the memory cells MC.

The first dummy cell area DCA is entirely the same as the dummy cell area DCA of the first embodiment. Specifically, dummy word lines DWL have the same structure as that of word lines WL, and dummy bit lines DBL are divided into parts for respective dummy cells DMC.

The normal memory cell area MCA and the second dummy cell area DCA2 are the same in structure. Specifically, the bit lines BL and the word lines WL are continuous, and each bit line BL and each word line WL are connected to all the memory cells MC belonging to a row and a column, respectively, to which the bit line BL and the word line WL belong. The normal memory cell area MCA and the second dummy cell area DCA2 are the same also in the structure of the memory cells MC. In addition, the normal memory cell area MCA and the second dummy cell area DCA2 are processed by the same process and under the same process condition. Memory cells MC in the second dummy cell area DCA2 are referred to as second dummy cells DMC2. In accordance with it, dummy cells DMC in the first dummy cell area DCA are referred to as first dummy cells DMC.

On the other hand, the normal memory cell area MCA and the second dummy cell area DCA2 are different in use and connection relationship to other elements. Specifically, the second dummy cells DMC2 are not used for holding data. Therefore, word lines WL which do not lie in the normal memory cell area MCA, that is, word lines WL (second dummy word lines DWL2) which lie only in the first and the second dummy cell areas DCA and DCA2 are connected to dummy control circuits RDD, like the dummy word lines DWL.

In the same manner, bit lines BL which do not lie in the normal memory cell area MCA, that is, bit lines BL (second dummy bit lines DBL2) which line only in the first and the second dummy cell areas DCA and DCA2 are connected to dummy control circuits CDD, like the dummy bit lines DBL.

All the structures, operations, and features of the second embodiment other than those explained above are the same as those described in the first embodiment.

According to the semiconductor storage device according to the second embodiment, the same advantage as that of the first embodiment can be obtained. In addition, according to the second embodiment, the second dummy cell area DCA2 is provided between the first dummy cell area DCA and the normal memory cell area MCA. Therefore, the influence of the process for the first dummy cell area DCA is absorbed by the second dummy cell area DCA2, and does not reach the normal memory cell area MCA. Specifically, even when the shape of components in an area located directly more inward than the first dummy cell area DCA changes because of nonuniformity of the process, the components influenced by the change are not used as normal memory cells MC. This prevents large difference in operation margin between memory cells MC, and ensures high operation margin of the semiconductor storage device.

The second embodiment can solve the problem of nonuniformity in shape because of difference in process, by providing the second dummy cell area DCA2. This advantage is more effective, as control of the shape in the vicinity of the boundary becomes more difficult because of shrinking of components of the semiconductor storage device. However, since the structure of the second dummy cell area DCA2 is the same as that of the normal memory cell area MCA, the second embodiment cannot limit the range of transmission of a leakage current caused by failure of the second dummy cells DMC only to the second dummy cells DMC. Therefore, it is preferable to select one of the first embodiment and the second embodiment, in consideration of importance of limitation of a leakage current caused by failure of dummy cells, and importance of suppression of decrease in operation margin caused by fluctuations in the shape of components because of nonuniformity of the process. Specifically, it is preferable to use the first embodiment which do not include the second dummy cell area DCA2 if fluctuations in shape because of nonuniformity of the process can be suppressed sufficiently enough to secure a required operation margin by using a processing technique of a very high accuracy. The first embodiment does not require consideration of suppressing the decreased operation margin because of fluctuations in shape, and can maximize the effect of suppressing the range of transmission of a leakage current. On the other hand, when it is necessary to suppress fluctuations in shape since the processing technique is not sufficiently high, limiting a leakage current and suppressing decreased operation margin simultaneously exist, and these objects can be achieved by the second embodiment.

Third Embodiment

In a third embodiment, among dummy word lines DWL and dummy bit lines DBL, only dummy word lines DWL are divided into parts for respective memory cells MC.

Figure 20:
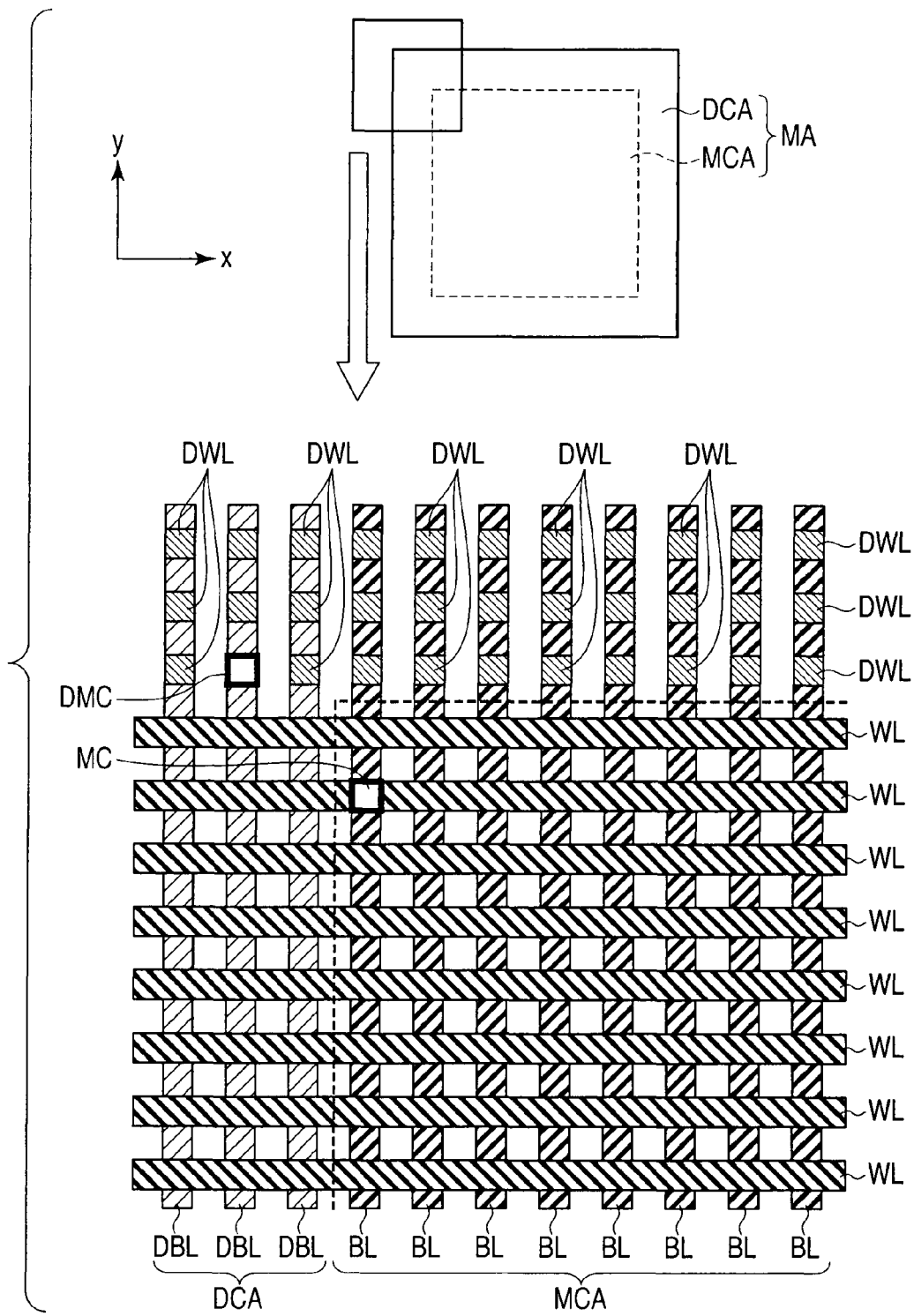
FIG. 20 schematically illustrates a structure of a part of a memory cell array according to a third embodiment.

FIG. 20 schematically illustrates a part of a structure of memory cell array MA according to the third embodiment, as viewed from above. As illustrated in FIG. 20, the dummy bit lines DBL have the same structure as the structure of bit lines BL. Specifically, the dummy bit lines BL are arranged on respective columns at regular intervals (for example, the minimum feature dimension F) along the y-direction of the memory cell array MA, and continuously extend from the upper end to the lower end of the memory cell array MA. On the other hand, the dummy word lines DWL are divided into parts for respective memory cells MC.

Figure 21:
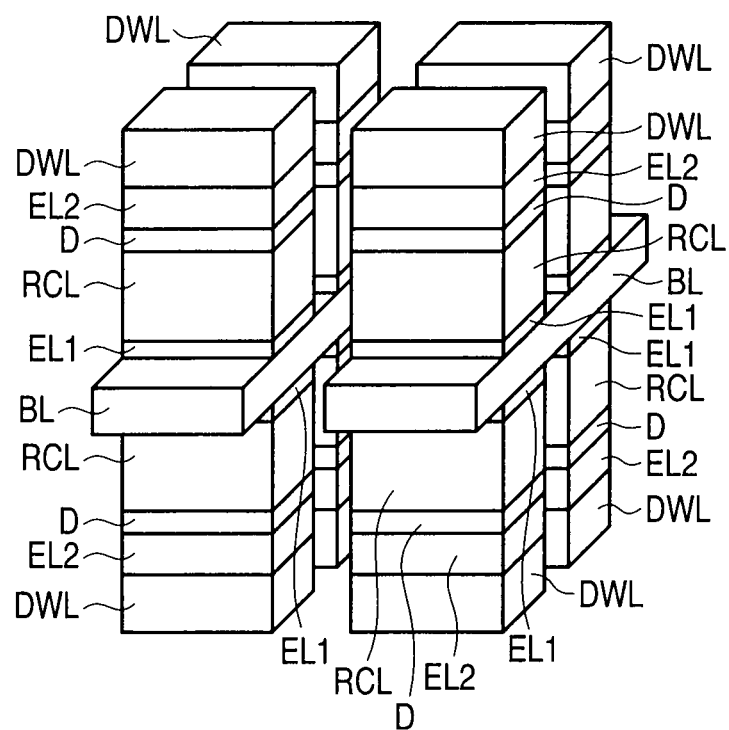
FIG. 21 is a perspective view illustrating a part of a structure of a dummy cell area according to the third embodiment.

FIG. 21 is a perspective view illustrating a part of a structure of a dummy cell area DCA according to the third embodiment. The dummy word lines DWL are divided into parts for respective memory cells MC and independent of one another, in the same manner as the dummy bit lines DBL of the first embodiment. The features of the dummy word lines DWL are the same as those of the dummy bit lines DBL according to the first embodiment. Specifically, a planar shape of the dummy word lines DWL can be the same as a planar shape of the memory cells MC (dummy cells DMC), and only some of dummy word lines DWL in the memory cell array MA may be separate, and the other dummy word lines DWL may be continuous like prior art. Further, the planar shape of one separate dummy word line DWL may be common to all the memory cell arrays MA, or may be limited to one or some of the memory cell arrays MA.

On the other hand, the structure of a normal memory cell area MCA including the bit lines BL and the word lines WL is the same as the first embodiment (FIG. 7). In addition, bit lines BL which lie in the dummy cell area DCA are not defined as dummy bit lines DBL as long as they partly lie in the normal memory cell area MCA, and has a continuous structure as illustrated in FIG. 7.

All the structures, operations, and features of the third embodiment other than those explained are the same as those described in the first embodiment.

Figure 22:
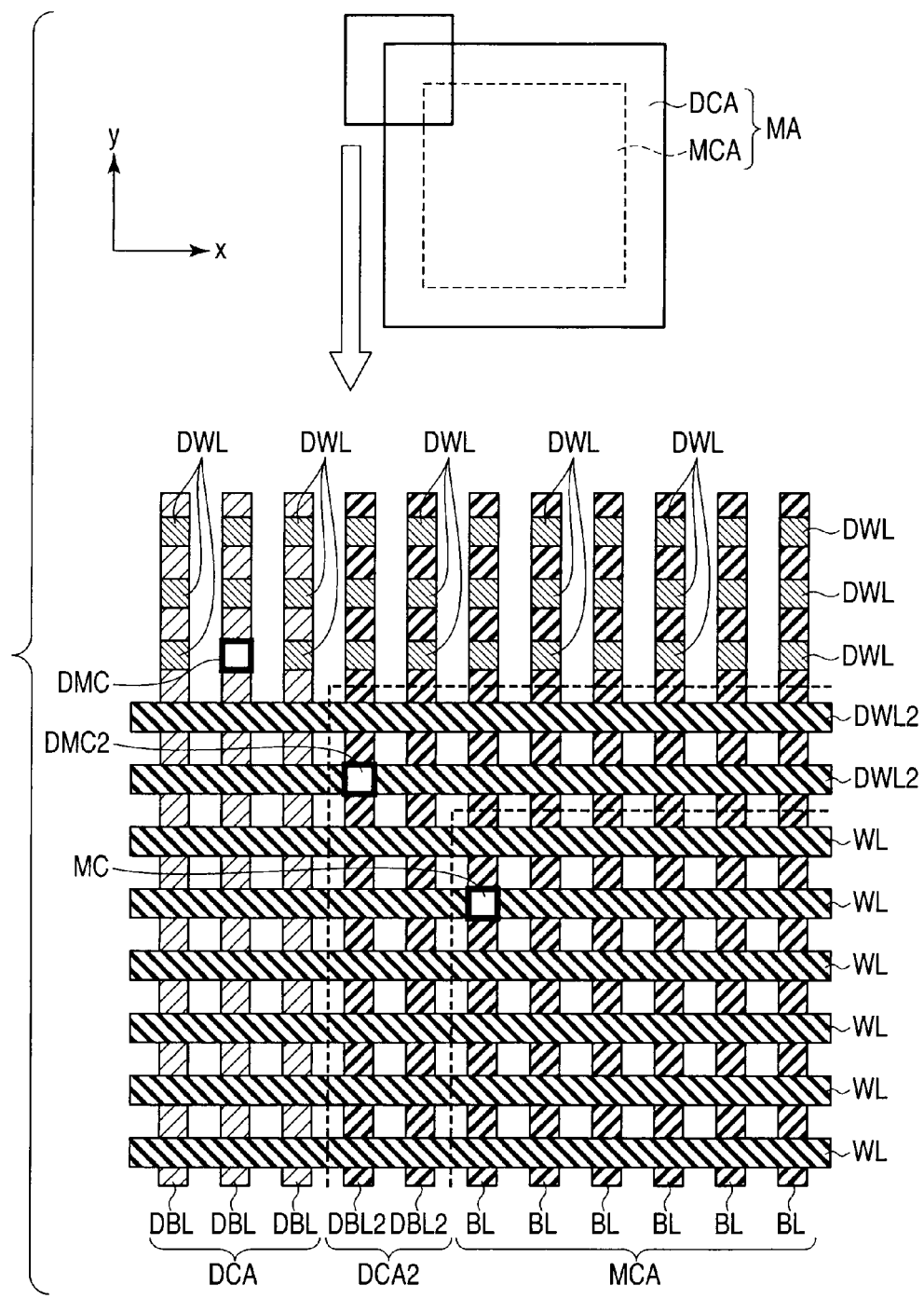
FIG. 22 schematically illustrates a part of a structure of a memory cell array of the third embodiment to which the second embodiment is applied.

The second embodiment also can apply to the third embodiment. Specifically, as illustrated in FIG. 22, in the structure of the third embodiment, the normal memory cell area MCA is divided into the second dummy cell area DCA2 and the normal memory cell area MCA, as explained in the second embodiment. The second dummy cell area DCA2 is entirely the same as that in the second embodiment.

As described above, according to the semiconductor storage device according to the third embodiment, the bit lines BL, the word lines WL, and the dummy bit lines DBL are continuous in the same manner as the first embodiment, and the dummy word lines DWL are divided into parts for respective memory cells MC and independent of one another. Therefore, according to the third embodiment, the same advantage as that of the first embodiment can be obtained according to the same theory as described with respect to the dummy bit lines DBL in the first embodiment.

In addition, by combining the third embodiment with the technique of the second embodiment, it is possible to obtain the same advantage as the advantage explained in the second embodiment in combination with the first embodiment. Also in this combination, only the third embodiment or the combination of the third embodiment and the second embodiment is properly selected, in consideration of the two objects and the processing technique used for the embodiments of the present invention. Thereby, it is possible to appropriately deal with problems which are different according to whether only the third embodiment is carried out or the combination of the third embodiment and the second embodiment is carried out.

Fourth Embodiment

In a fourth embodiment, both dummy word lines DWL and dummy bit lines DBL are divided into parts for respective memory cells MC.

FIG. 23 schematically illustrates a part of a structure of a memory cell array MA according to the fourth embodiment, as viewed from above. FIG. 24 is a perspective view illustrating a part of a structure of a dummy cell area DCA according to the fourth embodiment. As illustrated in FIGS. 23 and 24, the dummy bit lines DBL and the dummy word lines DWL have the same structures as those of the first embodiment and the third embodiment, respectively. Therefore, the dummy bit lines DBL and the dummy word lines DWL have the same planar shape.

All the structures, operations, and features of the fourth embodiment other than the explained elements are the same as those described in the first and the third embodiments.

The second embodiment also can apply to the fourth embodiment. Specifically, as illustrated in FIG. 25, in the structure of the fourth embodiment, a normal memory cell area MCA is divided into the second memory cell area DCA2 and the normal memory cell area MCA as explained in the second embodiment. The second dummy cell area DCA2 is entirely the same as the second embodiment.

As described above, according to the semiconductor storage device of the fourth embodiment, the bit lines BL and the word lines WL are continuous like the first and second embodiments, and the dummy bit lines DBL and the dummy word lines DWL are divided into parts for respective memory cells MC and independent of one another. Also according to the fourth embodiment, the same advantage as that of the first embodiment can be obtained according to the same theory as described with respect to the dummy bit lines DBL in the first embodiment.

In addition, by combining the fourth embodiment with the technique of the second embodiment, it is possible to obtain the same advantage as the advantage explained in the second embodiment in combination with the first embodiment. It is possible to appropriately deal with problems which are different between embodiments, by properly selecting whether only the fourth embodiment is carried out or the combination of the fourth and embodiments is carried out.

The present invention is not limited to the first to fourth embodiments explained above with respect to the present invention, but can be variously modified within a range not departing from the gist of the invention when the invention is carried out. In addition, the above embodiments include inventions of various stages, and various inventions can be extracted by proper combinations of components disclosed above. For example, even when some of components are removed from all the components in each embodiment, the structure from which the elements have been removed can be extracted as an invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
memory cells, each of which includes a variable-resistance layer which takes one of two resistance states according to at least one of an applied voltage and an applied current, and a diode having a cathode being connected to the variable-resistance layer, and has both ends of a serial structure of the variable-resistance layer and the diode as a first end and a second end;
a memory cell array which includes the memory cells arranged on a plane including a first axis and a second axis, and has a first region lying along an edge of the memory cell array and a second region lying opposite to the edge with respect to the first region;
a first wiring continuous along the first axis between both ends of the memory cell array, at least part of the first wiring lying in the second region, and the first wiring being connected to the first ends of the memory cells;
a second wiring which lies along the first axis, lies only in the first region and is connected to the first ends of the memory cells, the second wiring being divided between adjacent memory cells; and
a third wiring continuous along the second axis between both ends of the memory cell array, and being connected to the second ends of the memory cells, wherein
the second region includes a second part which encloses a first part along the first part and an edge of the second part,
the first wiring at least a part of which lies in the first part of the second region is connected to a first control circuit,
the first control circuit is configured to apply a potential necessary for writing and reading data in and from the memory cells to the first wiring connected to the first control circuit, and
the first wiring which lies only in the first region and the second part of the second region in the memory cell array is connected to a second control circuit.

2. The device according to claim 1, wherein
the second wiring is provided at the same level as the first wiring, and having the same composition as the first wiring.

3. The device according to claim 1, wherein
the first region encloses the second region.

4. The device according to claim 1, further comprising a second memory cell array including the memory cells,
wherein the memory cells of the second memory cell array lie above or under the memory cells of the memory cell array along a plane including the first and the second axes,
the first ends of the memory cells of the second memory cell array are connected to a surface of the first wiring opposite to the memory cells of the memory cell array,
the memory cells of the memory cell array and the memory cells of the second memory cell array are line-symmetric with each other with respect to the first wiring, and
each of the divided parts of the second wiring is connected to only one memory cell of the memory cell array and only one corresponding memory cell of the second memory cell array.

5. A semiconductor storage device comprising:
memory cells, each of which includes a variable-resistance layer which takes one of two resistance states according to at least one of an applied voltage and an applied current, and a diode having a cathode being connected to the variable-resistance layer, and has both ends of a serial structure of the variable-resistance layer and the diode as a first end and a second end;
a memory cell array which includes the memory cells arranged on a plane including a first axis and a second axis, and has a first region lying along an edge of the memory cell array and a second region lying opposite to the edge with respect to the first region;
a first wiring continuous along the first axis between both ends of the memory cell array, at least part of the first wiring lying in the second region, and the first wiring being connected to the first ends of the memory cells;
a second wiring which lies along the first axis, lies only in the first region and is connected to the first ends of the memory cells, the second wiring being divided between adjacent memory cells; and
a third wiring continuous along the second axis between both ends of the memory cell array, and being connected to the second ends of the memory cells, wherein
at least a part of the third wiring lies in the second region,
the device further comprises a fourth wiring which lies along the second axis and lies only in the first region, the fourth wiring being connected to the second ends of the memory cells and divided between adjacent memory cells.

6. The device according to claim 5, wherein
the second wiring is provided at the same level as the first wiring, and having the same composition as the first wiring and
the fourth wiring is provided at the same level as the third wiring, and having the same composition as the third wiring.

7. The device according to claim 5, wherein
the first region encloses the second region.

8. The device according to claim 5, further comprising a second memory cell array including the memory cells,
wherein the memory cells of the second memory cell array lie above or under the memory cells of the memory cell array along a plane including the first and the second axes,
the first ends of the memory cells of the second memory cell array are connected to a surface of the first wiring opposite to the memory cells of the memory cell array,
the memory cells of the memory cell array and the memory cells of the second memory cell array are line-symmetric with each other with respect to the first wiring, and
each of the divided parts of the second wiring is connected to only one memory cell of the memory cell array and only one corresponding memory cell of the second memory cell array.

9. The device according to claim 5, wherein
the second region includes a second part which encloses a first part along the first part and an edge of the second part,
the first wiring at least a part of which lies in the first part of the second region is connected to a first control circuit,
the first control circuit is configured to apply a potential necessary for writing and reading data in and from the memory cells to the first wiring connected to the first control circuit, and
the first wiring which lies only in the first region and the second part of the second region in the memory cell array is connected to a second control circuit.

10. The device according to claim 9, wherein
the second wiring is provided at the same level as the first wiring, and having the same composition as the first wiring and the fourth wiring is provided at the same level as the third wiring, and having the same composition as the third wiring.

11. The device according to claim 9, wherein the first region encloses the second region.

12. The device according to claim 9, further comprising a second memory cell array including the memory cells,
wherein the memory cells of the second memory cell array lie above or under the memory cells of the memory cell array along a plane including the first and the second axes,
the first ends of the memory cells of the second memory cell array are connected to a surface of the first wiring opposite to the memory cells of the memory cell array,
the memory cells of the memory cell array and the memory cells of the second memory cell array are line-symmetric with each other with respect to the first wiring, and
each of the divided parts of the second wiring is connected to only one memory cell of the memory cell array and only one corresponding memory cell of the second memory cell array.

\* \* \* \* \*